United States Patent [19]

Morisaki et al.

[11] 4,082,591
[45] Apr. 4, 1978

[54] SURFACE TREATMENT PROCESS FOR COPPER FOIL

[75] Inventors: Shigeyoshi Morisaki; Nobuo Kitamura, both of Ageo, Japan

[73] Assignee: Mitsui-Anaconda Electro Copper Sheet Co., Ltd., Japan

[21] Appl. No.: 727,624

[22] Filed: Sep. 28, 1976

[30] Foreign Application Priority Data

May 15, 1976 Japan .................. 51-27862

[51] Int. Cl.² .................. C25D 1/00
[52] U.S. Cl. .................. 156/150; 204/37 T
[58] Field of Search .......... 156/630, 632, 901, 150, 156/324; 204/12, 15, 37 R, 37 T, 43 Z, 54 R, 54 L; 75/154; 427/437, 98

[56] References Cited

U.S. PATENT DOCUMENTS

| | | | |
|---|---|---|---|
| 2,159,510 | 5/1969 | Pavlish et al. | 204/54 L X |
| 2,894,885 | 7/1959 | Gray | 204/37 T X |
| 2,900,314 | 8/1959 | Saubestre | 204/43 Z |
| 3,072,499 | 1/1963 | Cole | 427/437 X |
| 3,290,170 | 12/1966 | Houston | 75/154 X |
| 3,528,892 | 9/1970 | Mazur | 204/37 T X |
| 3,728,177 | 4/1973 | Caule | 156/630 |

*Primary Examiner*—David A. Simmons

[57] ABSTRACT

A process is disclosed for preventing oxidative coloring while maintaining good solderability of copper foil wherein a thin layer of tin or a combination of tin and zinc alloy is electro-deposited on the surface of the shiny side of copper foil and the tin or binary alloy diffuses into the surface portion of electrodeposited copper foil by heating, such as drying, baking or lamination under heat and pressure. By virtue of an extremely thin layer of the tin alloy thus formed, the bright tone of the copper surface is maintained during storage or during subsequent lamination of the foil, and the solderability thereof is also improved.

5 Claims, 2 Drawing Figures

SURFACE TREATMENT PROCESS FOR COPPER FOIL

BACKGROUND OF THE INVENTION

The present invention relates to the surface treatment of copper foil which is used for the production of printed circuit boards, and more particularly, a process for maintaining a bright copper tone during long storage and throughout lamination under heat and pressure, while at the same time retaining the solderability and/or solder-wetability of the surface of the copper foil. A copper foil to be laminated to printed circuit boards for various electronic applications requires superior properties in order to endure subsequent processes to which the foil may be subjected in forming finished circuit boards.

A printed circuit board is ordinally formed by a process wherein a copper foil is continuously produced electrolytically, the respective surfaces of the copper foil being a mat side and a shiny side. The mat side which is faced to the electrolyte solution during electrolysis is subsequently nodularized to adhere intimately to resinous material when it is compressed at high temperature, and the shiny side is treated to prevent oxidation during storage or lamination under heat and pressure. The mat side of the copper foil impregnated with resinous material is applied to a substrate and pressed to produce a copper-clad laminate at high temperature. In many cases however, the nodularized surface of the mat side is first applied with an adhesive, dried by heating and pressed to the resinous laminate at high temperature to form a copper clad laminate.

The copper clad laminate thus produced is formed to a desired pattern by various processes such as, drilling and/or punching, pattern etching, or the like, and is soldered by dipping the same in a solder bath. Accordingly, good solderability is indispensable for the shiny surface of the copper foil for printed circuit boards. Further, the copper surface is apt to be brown-colored by oxidation by virtue of the high temperatures required to adhere the copper foil to the laminate. Even at room temperature, the copper surface is often discolored or loses gloss during storage or transportation due to oxidation. In general, consumers always require the copper clad laminate to maintain a bright copper surface.

Although various methods for treating copper foil have been developed to satisfy the above requirements, none of them can satisfy all of these requirements at the same time. By one prior art process, solderability is deteriorated and by another process, the copper surface is significantly discolored by heat. For instance, treatment with benzotriazole and electrodeposition in chromate solution are well known prior art methods for surface treatment of copper foil. However, the copper foil treated with benzotriazole is significantly brown colored by heat treatment, although it shows good solderability and storage stability. On the other hand, the electrolytic chromate treatment of copper foil is also widely used, but this has the defect of poor solderability or solder-wetability, although it can maintain a bright copper surface against heat treatment and during storage.

It is accordingly an object of the present invention to provide a process to improve the solderability of the copper surface of a copper clad laminate. Another object of the invention is to provide a process to maintain a bright copper surface of the copper laminate against heat treatment and long storage at room temperature.

DESCRIPTION OF THE PREFERRED EMBODIMENT

According to the present invention, a thin layer of tin or tin and zinc alloy is electrodeposited on the shiny side of the surface of the copper foil, and the thin layer thus produced is diffused into the copper by successive heat treatment. The copper surface thus produced has the same appearance as that of the pure and fresh copper foil and moreover, exhibits good solderability. Further, the good appearance and solderability properties are not lost by heat nor long storage.

In the present invention, a thin layer of tin is electrodeposited on the shiny side of the copper foil. This tin layer is too thin to measure in order of mm or $\mu$, and easily diffused into the copper to form a tin and copper alloy by heating such as drying the adhesive coated on the nodularized surface of the copper to disperse its whitish color. Preferably, the thickness of the tin layer is such that the whitish color of the tin layer is observed slightly and the reddish color of the copper foil is also observed by the naked eye. By heating, the whitish color of the thin layer of tin is distinguished completely and the bright copper surface is clearly apparent, as the tin layer is very thin and the tin content of the tin alloy formed by diffusion of the tin layer is very low.

The copper foil thus treated is superior to that of the prior art, having good solderability and resistance against discoloration or coloration by heat and long storage to provide an excellent copper clad laminate for printed circuit boards.

On the other hand, in the case in which the copper foil is pressed to the resinous laminate without adhesive, the thin layer of tin diffuses into the surface part of the copper foil at the beginning of the heating lamination process and prevents the brownish coloration during said process.

We have also found that good results are obtained by electrodepositing a thin layer of tin and zinc alloy on the shiny surface of the copper foil instead of tin layer.

In the process of electrodeposition of a tin layer, there are many factors which affect the thickness of the tin layer and the quality of the final product.

Although alkaline and acid baths are well known, alkaline baths are preferable for the electrodeposition, resulting in a uniform layer of tin. For example, tin solution containing 2–100 g/l (preferably 10–50 g/l) of sodium hydroxide and/or potassium hydroxide or 30–300 g/l (preferably 50–100 g/l) of sodium pyrophosphate and/or potassium pyrophosphate is advantageously used as electrolyte. An alkaline concentration less than the lowest amount above described decreases the electrolytic efficiency of the bath by virtue of the high bath voltage required. In formulating the bath, a tin salt such as stannous sulfate or tin metal is dissolved in the electrolyte at a concentration of more than 0.3 g. of tin per 1 l. of electrolyte. A tin concentration of less than 0.3 g. of tin per 1 l. of electrolyte results in insufficient formation of the desired tin layer.

The amount of electricity required may be expressed in terms of the product of current density and the time of electrolysis (amount of electricity = current density × time of electrolysis) and 1.0–3 A·sec/dm$^2$, more preferably 1.2–2.0 A·sec/dm$^2$ is preferred. If less than 1.0 A·sec/dm$^2$ is employed, heat-coloring resistance of the copper surface may not be sufficient to the heating lamination process; and in the case of more than 3 A·sec/dm² the whitish tin color of the copper surface may not disappear during successive heating steps.

Room temperature is preferable for the electrolysis bath. Although tin is electrodeposited on the surface of the copper foil effectively at high temperatures, the copper foil so treated at this temperature during the electrodeposition process promotes the dissolution of the tin thus electrodeposited in successive water rinsing. The electrodeposition of tin at high temperatures is not effective.

The present invention will now be more specifically described with reference to the drawings and the following examples:

EXAMPLE 1

Figure 1:
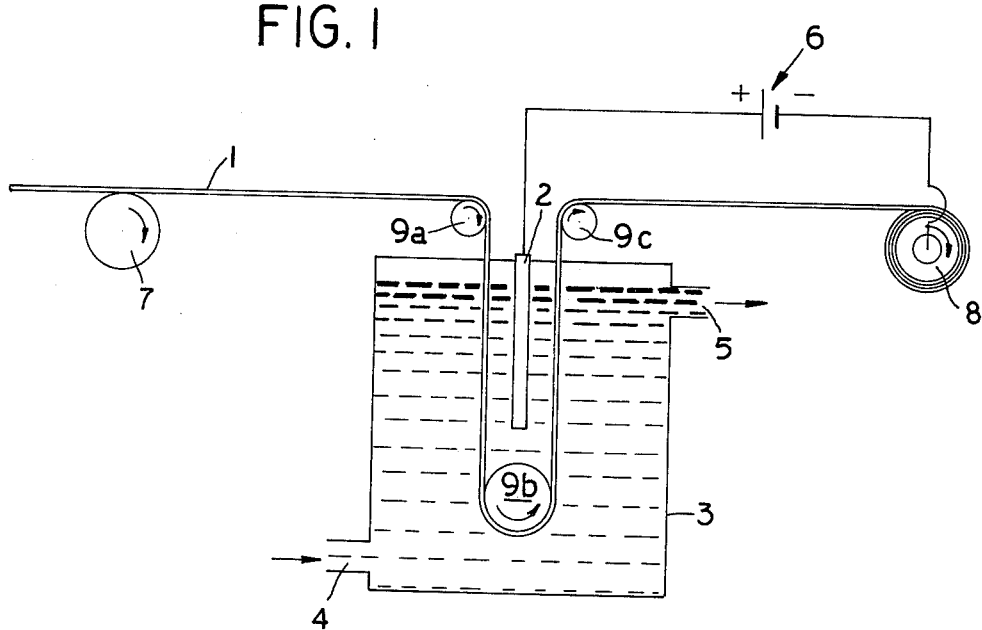
FIG. 1 shows a schematic cross-sectional view, showing an apparatus to electrodeposit a thin layer of tin on the surface of copper foil.

FIG. 1 shows a schematic cross sectional view, showing an apparatus to electrodeposit a thin layer of tin on the surface of copper foil. Referring to FIG. 1, the electrolyte was circulated in the electrolysis bath 3 by being supplied upwardly from supply port 4 at the lower part of the bath 3 and discharged from the discharge port 5 at the upper part of the bath 3. The discharged electrolyte was again supplied to the bath 3 from the supply port 4 and thus recirculated. An anode plate 2 made of stainless steel or tin was placed in the middle of the bath 3. A coil of copper foil 1 which was pretreated by washing with acid solution or water was recoiled or passed around roll 7, and supplied to the electrolytic bath 3 to surround the anode plate 2 assisted by guide rolls 9a, 9b and 9c and was finally recoiled in roll 8. The copper foil was passed through the electrolysis bath such that the copper foil to be treated (the shiny side) was facing the anode plate 2. Tin was electrodeposited on the shiny side of the copper foil facing the anode plate 2 by connecting the anode plate to the plus terminal of the source of the direct current electricity 6, and the coiling roll of copper foil 1 to the minus terminal of the source of electricity 6. After electrodeposition of the tin layer, the belt of copper foil was washed with water and dried (not shown in FIG. 1) and finally coiled up roll 8.

Figure 2:
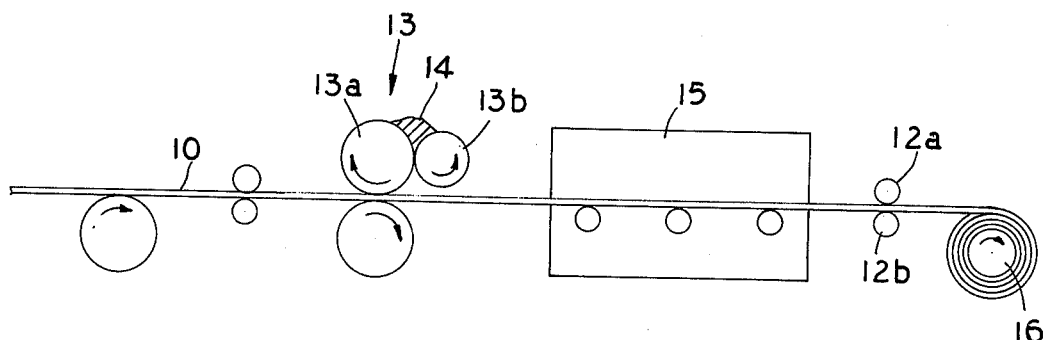
FIG. 2 shows a schematic cross-sectional view, showing an apparatus to apply the adhesive on the nodularized surface of the copper foil and dry the same.

FIG. 2 shows a schematic cross sectional view, showing an apparatus to apply the adhesive on the nodularized surface of the copper foil and dry the same. The mat side of the copper foil was previously nodularized. Adhesive 14 was supplied on the mat side of the belt of copperfoil 10 and the shiny side thereof was electrodeposited with a thin layer of tin by the apparatus illustrated in FIG. 1 utilizing a pair of coating rollers 13a and 13b and the belt 10 was dried in the drier 15, carried by a pair of rollers 12a and 12b and finally coiled up on roll 16. A mixture of polyvinyl butylal and phenolic resin was used as adhesive in this example. Butvar-72 (Trade mark) provided by Sharwinigan & Co. and plyophen (Trade mark) provided by Reichhold Chemical Inc. are examples of phenolic resins useful in accordance with this invention. Any hot air circulating drier of well known types may be used as drier 15. The coating roller 13 comprises a pair of rollers 13a and 13b which have the function of an adhesive feeder. The roller 13a was located so as to touch slightly the belt of the copper foil 10 at the lowest point thereof. By the rotation of the rollers 13a and 13b, the adhesive was coated on the surface of both rollers. The adhesive coated on the roller 13a was transferred to the mat side of the copper foil 10, when it passed under the lowest point of the roller 13a. The copper foil thus coated with the adhesive 14 was conveyed in the drier 15. During passing the drier 15, the adhesive was dried incompletely as a so-called "B-stage" and at this time the tin layer was diffused into the copper foil, and the thin layer of tin and copper alloy was thus formed on the shiny side of the copper foil. Then, the adhesive coated copper foil thereby produced was coiled up on roll 16.

The copper foils for printed circuit boards of 35 μ of thickness were electrodeposited with tin by the apparatus illustrated in FIG. 1 under various conditions listed in Table 1, hereinafter described. For comparison purposes the same copper foil was immersed in 1 g/l of benzotriazole solution for 20 seconds, and the same copper foil was electrodeposited in a solution containing 0.4 g of chromate anhydride per 1 liter at 0.3 A/dm² current density for 7 seconds, employing copper foil as the anode.

Then, the copper foils thus treated were tested as follows: The coloration or discoloration was evaluated by observation with the naked eye in terms of the color of the copper surface after heating pressing on the glass epoxy pre-preg at 170° C for 10, 20, 40 and 60 minutes. In Table 1 the sign O means that no coloring or discoloration was observed; the sign Δ means slight brownish coloration; and the sign X means that brownish coloration was observed. Solderability was judged by observation with the naked eye about the condition of the solder layer on the copper surface after the copper foils were dipped into the solder bath at 260° C for 0.5 seconds. The sign O means that the complete glossy solder layer was formed on the copper surface; the sign Δ means that the broken solder layer was spread on the copper surface and the sign X means that the solder was not spread but made round on the copper surface. These results are set forth in Table 1.

All of the copper foils listed in Table 1 were stored for 6 months in room temperature, and coloring or discoloration was not observed.

Table 1

| concentration of $K_4P_2O_7$ g/l | concentration of NaOH g/l | concentration of tin g/l as Sn | current density A/dm² | time of electrodeposition sec. | amount of electricity A.sec/dm² | discoloration by heat 10 min | 20 min | 40 min | 60 min | solderability | appearance just after the electrodeposition |
|---|---|---|---|---|---|---|---|---|---|---|---|
| 5 | | 0.1 | 0.15 | 10 | 1.5 | O | Δ | X | X | Δ | |
| 10 | | 0.1 | 0.15 | 10 | 1.5 | O | O | Δ | X | Δ | |
| 10 | | 0.3 | 0.15 | 10 | 1.5 | O | O | O | Δ | Δ | |
| 30 | | 0.1 | 0.15 | 10 | 1.5 | O | O | Δ | X | Δ | |
| 30 | | 0.3 | 0.15 | 10 | 1.5 | O | O | O | O | O | * |
| 100 | | 0.1 | 0.15 | 10 | 1.5 | O | O | Δ | X | Δ | |
| 100 | | 0.3 | 0.15 | 10 | 1.5 | O | O | O | O | O | * |
| 100 | | 0.3 | 0.1 | 10 | 1.0 | O | O | O | O | O | * |

Table 1-continued

| concentration of $K_4P_2O_7$ g/l | concentration of NaOH g/l | concentration of tin g/l as Sn | current density A/dm² | time of electrodeposition sec. | amount of electricity A.sec/dm² | discoloration by heat 10 min | 20 min | 40 min | 60 min | solderability | appearance just after the electrodeposition |
|---|---|---|---|---|---|---|---|---|---|---|---|
| 100 |  | 0.3 | 0.1 | 5 | 0.5 | O | O | Δ | X | Δ |  |
| 300 |  | 0.05 | 0.1 | 10 | 1.0 | O | Δ | X | X | Δ |  |
| 300 |  | 0.1 | 0.1 | 10 | 1.0 | O | O | O | Δ | Δ |  |
| 300 |  | 0.3 | 0.1 | 10 | 1.0 | O | O | O | O | O | * |
|  | 1 | 0.3 | 0.15 | 10 | 1.5 | O | O | Δ | X | Δ |  |
|  | 5 | 0.3 | 0.15 | 10 | 1.5 | O | O | O | Δ | Δ |  |
|  | 10 | 0.3 | 0.15 | 10 | 1.5 | O | O | O | O | O | * |
|  | 100 | 0.3 | 0.15 | 10 | 1.5 | O | O | O | O | O | * |
| treatment with benzotriazole solution |  |  |  |  |  | O | X | X | X | O |  |
| electrodeposition in chromate solution |  |  |  |  |  | O | O | Δ | X | Δ |  |

*whitish but reddish color of copper was observed

What we claim is:

1. A process for the surface treatment of copper foil, comprising electrodepositing, in an alkaline bath containing more than 0.3 g. of Sn/l, at a current density of from about 1 to 3 A·sec/dm², on a shiny metallic side of copper foil a thin layer of tin to the extent that the whitish color of the deposited tin is minimized and the reddish color of the copper surface is maintained, followed by heating the foil so produced to diffuse said tin layer into the copper layer and thereby to produce a thin layer of tin and copper alloy.

2. A process as claimed in claim 1, wherein said copper foil is applied to a substrate with adhesive and is dried by applying heat thereto.

3. A process as claimed in claim 1, wherein said copper foil is heated during lamination to a substrate under application of heat and pressure.

4. A process as claimed in claim 1, wherein the alkaline bath contains from about 30 to 300 g/l of a pyrophosphate selected from sodium and potassium pyrophosphate.

5. A process as claimed in claim 1, wherein the alkaline bath contains from about 10 to 50 g/l of an alkali hydroxide selected from sodium and potassium hydroxide.

* * * * *